United States Patent
Martinez et al.

(10) Patent No.: US 9,607,935 B2
(45) Date of Patent: Mar. 28, 2017

(54) SEMICONDUCTOR CHIP PACKAGE WITH UNDERMOUNT PASSIVE DEVICES

(75) Inventors: Liane Martinez, New Market (CA); Neil McLellan, Toronto (CA); Silqun Leung, Richmond Hill (CA); Gabriel Wong, Richmond Hill (CA)

(73) Assignee: ATI Technologies ULC, Markham (CA)

( * ) Notice: Subject to any disclaimer, the term of this patent is extended or adjusted under 35 U.S.C. 154(b) by 1408 days.

(21) Appl. No.: 12/427,133

(22) Filed: Apr. 21, 2009

(65) Prior Publication Data

US 2010/0265682 A1    Oct. 21, 2010

(51) Int. Cl.
*H05K 7/00* (2006.01)
*H01L 23/498* (2006.01)
(Continued)

(52) U.S. Cl.
CPC ........ *H01L 23/49816* (2013.01); *H01L 23/50* (2013.01); *H05K 1/0231* (2013.01); *H01L 2224/0557* (2013.01); *H01L 2224/0562* (2013.01); *H01L 2224/05139* (2013.01); *H01L 2224/05144* (2013.01); *H01L 2224/05147* (2013.01); *H01L 2224/05164* (2013.01); *H01L 2224/05169* (2013.01); *H01L 2224/05573* (2013.01); *H01L 2224/05611* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05669* (2013.01); *H01L 2224/16225* (2013.01); *H01L 2224/32225* (2013.01); *H01L 2224/73203* (2013.01); *H01L 2224/73204* (2013.01); *H01L 2924/01019* (2013.01); *H01L 2924/01322* (2013.01); *H01L 2924/09701* (2013.01); *H01L 2924/15311* (2013.01); *H05K 1/145* (2013.01); *H05K 3/3442* (2013.01); *H05K 2201/1053* (2013.01); *H05K 2201/10636* (2013.01);
(Continued)

(58) Field of Classification Search
USPC ........................................................ 361/782
See application file for complete search history.

(56) References Cited

U.S. PATENT DOCUMENTS 6,404,649 B1    6/2002   Drake et al.
7,123,465 B2   10/2006   Crane et al.
(Continued)

OTHER PUBLICATIONS

Murata Manufacturing Co., Ltd.; *Chip Monolithic Ceramic Capacitors*; http://www.murata.com/; Sep. 1, 2008; pp. 1-155.
(Continued)

*Primary Examiner* — Tremesha S Willis
(74) *Attorney, Agent, or Firm* — Timothy M. Honeycutt

(57) ABSTRACT

Various semiconductor chip packages with undermounted passive devices and methods of making the same are disclosed. In one aspect, a method of manufacturing is provided that includes coupling a semiconductor chip to a first side of a carrier substrate where the carrier substrate includes a second side opposite the first side. At least one passive device is coupled to the second side of the carrier substrate. The at least one passive device includes at least one first terminal electrically coupled to the semiconductor chip and at least one second terminal adapted to couple to a printed circuit board.

18 Claims, 4 Drawing Sheets

(51) Int. Cl.
*H01L 23/50* (2006.01)
*H05K 1/02* (2006.01)
*H05K 1/14* (2006.01)
*H05K 3/34* (2006.01)

(52) U.S. Cl.
CPC ... *H05K 2201/10734* (2013.01); *Y02P 70/611* (2015.11); *Y10T 29/4913* (2015.01)

(56) References Cited

U.S. PATENT DOCUMENTS

| | | |
|---|---|---|
| 7,463,492 B2 * | 12/2008 | Radhakrishnan et al. .... 361/782 |
| 2003/0218235 A1 | 11/2003 | Searls et al. |
| 2004/0256133 A1 | 12/2004 | Dishongh et al. |
| 2006/0158863 A1 | 7/2006 | Hsu |
| 2008/0055873 A1 * | 3/2008 | Mi et al. ....................... 361/761 |

OTHER PUBLICATIONS

Kiyoyuki Nakagawa; *Needs for 01005-Style Parts Drive Mounting, Packaging Gains*; AEI Mar. 2007; pp. 37-38 and 53.
Yusuke Goto; *Murata's Capacitors Zero in on Increasing Frequency, Reducing Loss*; AEI Sep. 2007; pp. 41-44.
Murata Manufacturing Co., Ltd.; *Monolithic Ceramic Capacitor GRM0222C1A Series*; http://www.murata.com/archives/200810grm0222c1a-series.html; Sep. 2008; p. 1.
PCT/US2010/030035 International Search Report mailed Jul. 16, 2010.

* cited by examiner

SEMICONDUCTOR CHIP PACKAGE WITH UNDERMOUNT PASSIVE DEVICES

BACKGROUND OF THE INVENTION

1. Field of the Invention

This invention relates generally to semiconductor processing, and more particularly to semiconductor chip packaging incorporating passive devices and to methods of manufacturing the same.

2. Description of the Related Art

All integrated circuits require electrical power to operate, and packaged integrated circuits are no exception. Power is normally delivered to integrated circuits via a power supply and some form of power delivery network. Although currently-available power supplies are designed to supply stable voltages, the actual power delivered to integrated circuits can contain significant amounts of noise. There are many sources of noise, such as voltage fluctuations caused by other devices coupled to the power supply, electromagnetic interference and other causes.

Conventional packaged integrated circuits typically include a semiconductor chip mounted on a carrier substrate. The carrier substrate is configured to mount to a printed circuit board, such as a motherboard or card. The typical conventional carrier substrate includes an interconnect system that is made up of multiple layers of conductor planes or traces tied vertically by plural vias. Input/output pads on the die side of the carrier substrate connect to the die and input/output pads on the underside of the carrier substrate connect to the printed circuit board. A ball grid array, a land grid array or pin grid array is used to electrically connect the underside input/output pads to the printed circuit board.

To address issues associated with power supply noise, conventional semiconductor chip packages use decoupling capacitors. Many of these decoupling capacitors are mounted to the carrier substrate. In one conventional variant, the decoupling capacitors are mounted to the die side of the carrier substrate around the periphery of the die. In another conventional variant, the decoupling capacitors are mounted to the underside of the carrier substrate. In the first conventional variant, the electrical pathways from a given underside input/output pad to a die side decoupling capacitor can be large enough to diminish the effectiveness of the decoupling capacitor as a filter. The same may be true for the second conventional variant since the undermounted capacitors are not tied directly to the printed circuit board, but instead rely on the pads and other metallization structures within the carrier substrate to establish connections with the printed circuit board.

The present invention is directed to overcoming or reducing the effects of one or more of the foregoing disadvantages.

SUMMARY OF THE INVENTION

In accordance with one aspect of the present invention, a method of manufacturing is provided that includes coupling a semiconductor chip to a first side of a carrier substrate where the carrier substrate includes a second side opposite the first side. At least one passive device is coupled to the second side of the carrier substrate. The at least one passive device includes at least one first terminal electrically coupled to the semiconductor chip and at least one second terminal adapted to couple to a printed circuit board.

In accordance with another aspect of the present invention, a method of manufacturing is provided that includes coupling a semiconductor chip to a first side of a carrier substrate where the carrier substrate includes a second side opposite the first side. The second side of the carrier substrate is coupled to a printed circuit board with plural solder structures so as to leave a gap between the second side of the carrier substrate and the printed circuit board. At least one first terminal of a passive device is coupled to the second side of the carrier substrate and at least one second terminal of at least one passive device is coupled to the printed circuit board.

In accordance with another aspect of the present invention, an apparatus is provided that includes a carrier substrate that has a first side and a second side opposite the first side. A semiconductor chip is coupled to the first side of the carrier substrate. At least one passive device is coupled to the second side of the carrier substrate and has at least one terminal adapted to couple to a printed circuit board.

In accordance with another aspect of the present invention, an apparatus is provided that includes a printed circuit board and a carrier substrate that has a first side and a second side opposite the first side. The second side includes plural solder structures coupled to the printed circuit board so as to leave a gap between the second side of the carrier substrate and the printed circuit board. A semiconductor chip is coupled to the first side of the carrier substrate. At least one passive device is positioned in the gap and includes at least terminal coupled to the second side of the carrier substrate and at least terminal coupled to the printed circuit board.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of semiconductor chip packages are disclosed herein. A typical exemplary embodiment includes a semiconductor chip mounted on a package or carrier substrate. Passive devices are mounted on an underside of the carrier substrate in configurations that enable the passive devices to directly connect to another printed circuit board. Additional details will now be described.

Figure 1:
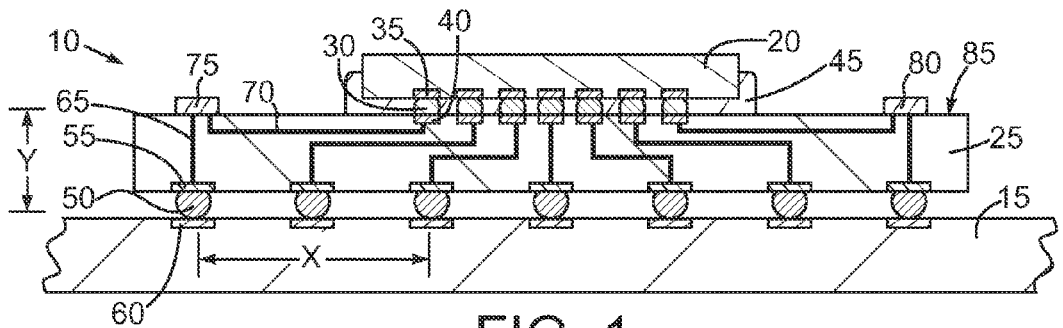
FIG. 1 is a sectional view of a conventional semiconductor chip package.

In the drawings described below, reference numerals are generally repeated where identical elements appear in more than one figure. Turning now to the drawings, and in particular to FIG. 1, therein is shown a sectional view of an exemplary conventional semiconductor chip package 10 mounted on a printed circuit board 15, only a portion of which is visible in FIG. 1. The package 10 includes a semiconductor chip 20 mounted in flip-chip fashion on a carrier substrate 25 and electrically connected to the carrier substrate 25 by way of a plurality of solder joints, one of which is labeled 30. The solder joint 30 is electrically connected to the chip by a bump pad 35 and to the carrier substrate 25 by another conductor pad 40. This arrangement typifies the other solder joints as well. An underfill material layer 45 is disposed between the chip 20 and the carrier substrate 25 to alleviate issues of differing coefficients of thermal expansion. The carrier substrate 25 interfaces electrically with the printed circuit board 15 by way of a ball grid array that consists of a plurality of solder balls, one of which is labeled 50 and exemplifies the others. The carrier substrate includes a ball pad 55 that is metallurgically bonded to the solder ball 50. The solder ball 50 is also metallurgically bonded to a corresponding ball pad 60 on the printed circuit board 15. The solder balls 50 are typically initially connected to the carrier substrate 25 and then brought into proximity and/or physical contact with the corresponding ball pads 60 of the printed circuit board 15 and a reflow process performed in order to establish permanent metallurgical bonds. The electrical pathways between the solder balls 50 and the solder joints 30 are established by way of an interconnect system that includes plural conductor traces, planes and vias that are represented schematically by the black lines, two of which are labeled 65 and 70.

To provide decoupling capacitance, one or more decoupling capacitors 75 and 80 are positioned on an upper surface 85 of the carrier substrate 25. The decoupling capacitor 75 forms part of the electrical circuit between the solder ball 50 and the solder joint 30. One limitation associated with the conventional design depicted in FIG. 1 is the length of an electrical pathway associated with a given decoupling capacitor, an input/output site of the carrier substrate 25 connected to the printed circuit board 15, and an input/output site connected to the semiconductor chip 20. For example, the sum of the quantities X and Y represents the length of the electrical pathway associated with the decoupling capacitor 75, the solder joint 50 and the solder joint 30. This pathway length represents not only a longer pathway from an electrical transmission standpoint but also possibly a higher equivalent series inductance which may effect the speed of signals and/or power propagating on the pathway.

Figure 2:
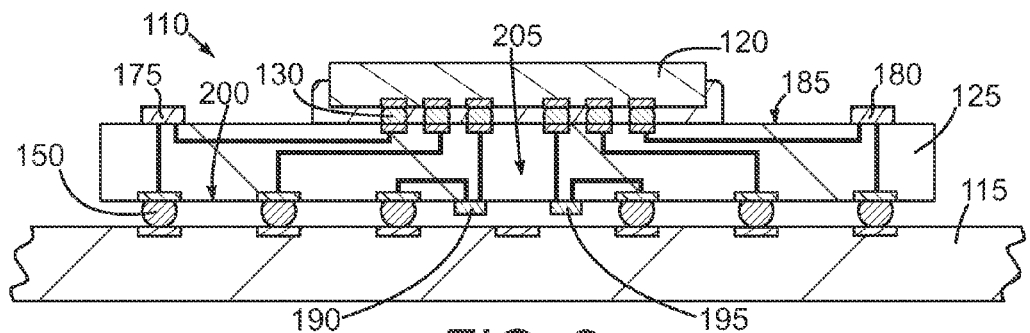
FIG. 2 is a sectional view of another conventional semiconductor chip package.

Another conventional semiconductor chip package 110 is depicted in section in FIG. 2. The package 110 is shown mounted on a printed circuit board 115 and includes a semiconductor chip 120 flip-chip mounted on a carrier substrate 125. Plural solder joints 130 electrically connect the chip 120 to the carrier substrate 125. The electrical pathways associated with the joints 130 may be identical to that described above for the solder joints 30 in FIG. 1. A ball grid array of the type described in conjunction with FIG. 1 electrically connects the carrier substrate 125 to the printed circuit board 115 and includes plural solder balls 150. This conventional embodiment includes decoupling capacitors 175 and 180 mounted on an upper surface 185 of the carrier substrate 125. In addition, decoupling capacitors 190 and 195 are coupled to a lower surface 200 of the carrier substrate 125 near the center 205 thereof. The electrically transmissive pathways associated with the undermounted decoupling capacitors 190 and 195 still rely on the electrical routing of conductor traces, vias and planes within the carrier substrate 125.

Figure 3:
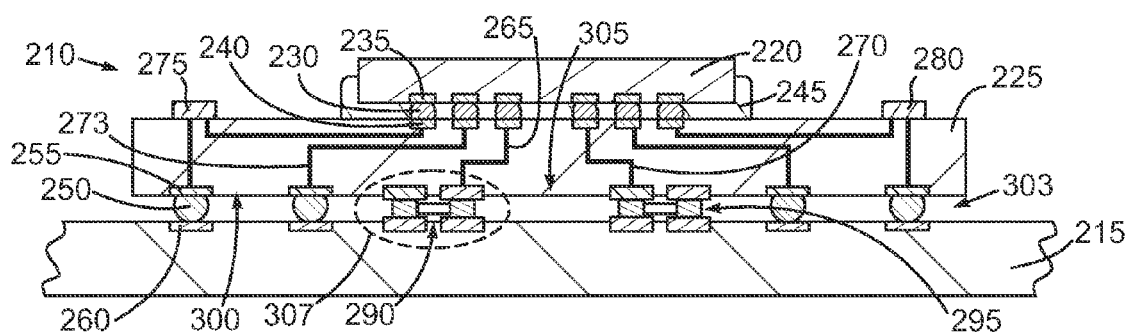
FIG. 3 is a sectional view an exemplary embodiment of a semiconductor chip package.

An exemplary embodiment of a semiconductor chip package 210 which employs a different passive device mounting scheme may be understood by referring now to FIG. 3. FIG. 3 is a sectional view depicting the semiconductor chip package 210 mounted on a printed circuit board 215. The semiconductor chip package 210 includes a semiconductor chip 220 mounted to a carrier substrate 225. The semiconductor chip 220 may be any of a myriad of different types of circuit devices used in electronics, such as, for example, microprocessors, graphics processors, combined microprocessor/graphics processors, application specific integrated circuits, memory devices or the like, and may be single or multi-core. The semiconductor chip 220 may be fabricated using silicon, germanium or other semiconductor materials. If desired, the semiconductor chip 220 may be fabricated as a semiconductor-on-insulator substrate or as bulk semiconductor. It should be understood that multiple dice in a stacked or other arrangement could be used.

The carrier substrate 225 may be composed of ceramics or organic materials as desired. If organic, the substrate 225 may actually consist of multiple layers of metallization and dielectric materials that make up an interconnect system represented schematically by the thick black lines. The carrier substrate 225 may interconnect electrically with external devices, such as the printed circuit board 215, in a variety of ways, such as via a pin grid array, a land grid array, a ball grid array or other configuration. The number of individual layers for the carrier substrate 225 is largely a matter of design discretion. In certain exemplary embodiments, the number of layers may vary from two to sixteen. If such a build-up design is selected, a standard core, thin core or coreless arrangement may be used. The dielectric materials may be, for example, epoxy resin with or without fiberglass fill. Of course, the carrier substrate 225 could be configured as something other than a package substrate, such as a printed circuit board serving as a motherboard, a daughter board, a card or some other type of board.

The printed circuit board 215 may be virtually any type of printed wiring board serving a variety of functions. Examples include motherboards, circuit cards, other types of printed circuit boards. The printed circuit board 215 will typically include alternating layers of dielectric and metallization.

In this illustrative embodiment, the semiconductor chip 220 is flip-chip mounted to the carrier substrate 225 and electrically connected thereto by way of plural solder joints, one of which is labeled 230 and exemplary of the others. The solder joint 230 is metallurgically bonded to a bump pad 235 of the semiconductor chip 220 and a bump pad 240 of the carrier substrate 225. The solder joint 230 may be composed of lead-free or lead-based solders. An exemplary lead-based solder may have a composition at or near eutectic proportions, such as about 63% tin and 37% lead. Lead-free examples include tin-silver (about 97.3% Sn 2.7% Ag), tin-copper (about 99% Sn 1% Cu), tin-silver-copper (about 96.5% Sn 3% Ag 0.5% Cu) or the like. The solder joint 230 may be formed on or coupled to the bump pad 235 of the semiconductor chip 220 by a stencil print process followed by a reflow process. A presolder may be of the same or different composition may be formed on the pad 240 and a reflow process performed to merge the two into the joint 240. Other types of chip-to-substrate interconnects could be used, such as conductive pillars composed of, for example, copper, silver, gold, platinum, palladium, combinations of these or the like, or so-called through-silicon vias or others.

An underfill material layer 245 composed of, for example, well-known epoxy materials with or without glass or other fillers, may be interposed between the chip 220 and the carrier substrate 225 to protect the solder joints 230 and the semiconductor chip from thermal strains associated differing coefficients of thermal expansion. Surface tension injection or other application techniques may be used to position the layer 245.

The pads 235 and 240 may be composed of a variety of conducting materials, such as, for example, copper, silver, gold, platinum, palladium, combinations of these or the like. If necessary, a solder-wettable coating may be applied to the pads 235 and 240 composed of, for example, tin, indium, antimony, gold, nickel, combinations or laminates of these or the like. Immersion coating, flash or other application techniques may be used.

The carrier substrate 225 may connect electrically to the printed circuit board 215 by way of a plural solder structures or balls that may form a ball grid array. One of the solder balls is labeled 250 and will be used to exemplify the others. The solder ball 250 is metallurgically bonded to a ball pad 255 of the carrier substrate 225 and a corresponding ball pad 260 of the printed circuit board 215. The solder ball 250 may be composed of lead-free or lead-based solders. An exemplary lead-based solder may have a composition at or near eutectic proportions, such as about 63% tin and 37% lead. Lead-free examples include tin-silver (about 97.3% Sn 2.7% Ag), tin-copper (about 99% Sn 1% Cu), tin-silver-copper (about 96.5% Sn 3% Ag 0.5% Cu) or the like. The solder ball 250 may be formed on or coupled to the ball pad 255 of the carrier substrate 225 by a stencil print process followed by a reflow process.

The pads 255 and 260 may be composed of a variety of conducting materials, such as, for example, copper, silver, gold, platinum, palladium, combinations of these or the like. If necessary, a solder-wettable coating may be applied to the pads 255 and 260 composed of, for example, tin, indium, antimony, gold, nickel, combinations or laminates of these or the like. Immersion coating, flash or other application techniques may be used.

As noted above, the substrate 225 includes an interconnect system that consists of plural conductor lines, traces, vias and planes. This interconnect system is schematically represented by the black lines, three of which are labeled 265, 270 and 273.

The semiconductor chip package 210 may include passive devices 275 and 280 positioned on an upper surface 285 of the carrier substrate 225. One or more passive devices 290 and 295 may be connected to a lower surface 300 of the carrier substrate 225 and positioned in a gap 303 between the lower surface 300 and the printed circuit board 215. Unlike the conventional package 110 depicted in FIG. 2, the passive devices 290 and 295 are not connected to the printed circuit board by way of the solder balls 250 and substrate interconnect system. Instead a more direct connection is used. This results in a shorter electrical pathway between the passive devices 290 and 295 and the printed circuit board 215. The passive device 290 may be tied electrically to one of the solder joints of the semiconductor chip 220 by, for example, the conductive pathway 265, and the passive device 295 may be similarly electrically connected by way of the conductor pathway 270. The passive devices 290 and 295 are in this embodiment positioned nearer to a central region 305 of the carrier substrate 225 than the solder balls 250 and may displace what would otherwise be additional solder balls. The passive devices 290 and 295 may be capacitors, inductors, resistors or other devices and provided in various numbers and sizes.

In this illustrative embodiment, the passive device 290 may be a capacitor. The following description of the passive device 290 will be exemplary of the passive device 295. The portion of FIG. 3 circumscribed by the dashed oval 307 will be shown at greater magnification in FIG. 4 and used to describe additional details of the passive device 290. Attention is now turned to FIG. 4. Due to the location of the dashed oval 307, a portion of the carrier substrate 225, the conductive pathway 270 and the printed circuit board 215 are visible. The capacitor 290 in this illustrative embodiment includes two terminals 309 and 311 that are positioned on opposite sides of a core 313 that consists of an insulating coating and a capacitive plate structure that will be described in greater detail in conjunction with subsequent figures. The external terminal 309 is electrically connected to the carrier substrate 225 by way of a solder structure 316, which may in-turn be metallurgically bonded to a conductor pad 318 that is part of the interconnect system of the carrier substrate 225. The external terminal 309 is also connected to a solder structure 321 that may be similarly metallurgically bonded to a conductor pad 323 in the printed circuit board 215. The external terminal 311 may be metallurgically connected to solder structures 326 and 328 which are, in-turn, bonded to respective conductor pads 331 and 333 in the carrier substrate 225 and the printed circuit board 215. In this illustrative embodiment, the conductor pad 331 is tied to the conductive pathway 270 of the carrier substrate 225. The terminal 309 may be connected to ground, power or signal and the terminal 311 may be connected to power, ground or signal or vice versa. To form the solder structures 316 and 326, the carrier substrate 225 may be provided with a solder mask 336 that is appropriately lithographically patterned to establish openings proximate the pads 318 and 331. A solder paste or other type of solder structure may be deposited in the openings and a reflow performed to establish metallurgical bonds with the external terminals 309 and 311. The solder structures 321 and 328 may be similarly fabricated with the aid of a solder mask 339 formed on the printed circuit board 215. The solder masks 336 and 339 may be composed of a variety of suitable materials for solder mask fabrication, such as, for example, PSR-4000 AUS703 manufactured by Taiyo Ink Mfg. Co., Ltd. or SR7000 manufactured by Hitachi Chemical Co., Ltd. The solder structures 316, 321, 326 and 328 may be formed from the same types of solder materials disclosed elsewhere herein.

It is clearly desirable to avoid shorting between the structures 316 and 326. Accordingly, caution should be exercised in selecting the volumes of the solder structures 316 and 326 so that lateral migration and shorting does not occur during reflow. As a further measure to avoid shorting, it may be desirable to first solder the external terminals 309 and 311 to the solder structures 316 and 326 using a solder with a higher melting point than the solder structures 321 and 328. In this way, the capacitor 290 may be initially soldered to the structures 316 and 326, then brought into proximity to the structures 321 and 328 and subjected to a reflow process. If the structures 316 and 326 are composed of a higher melting point solder, then the reflow process to establish connections to the solder structures 321 and 328 will not result in any liquification of the solder structures 316 and 326 which might otherwise cause undesirable shorts.

The height, $Z_1$, of the gap 303 will depend upon the amount of collapse of the solder balls 250 depicted in FIG. 3 during a reflow process to establish bonds to the printed circuit board 215. It may be that the capacitor 290 with a vertical dimension, $Z_2$, represents the minimum dimension, $Z_1$, of the gap 303 if during reflow the solder balls 250 collapse to such an extent that the carrier substrate 225 actually bottoms out on the capacitor 290.

Figure 4:
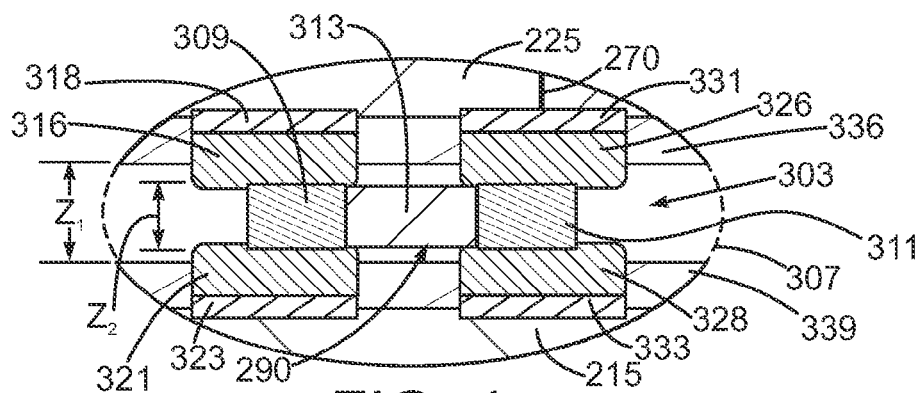
FIG. 4 is a portion of FIG. 3 shown at greater magnification.
Figure 5:
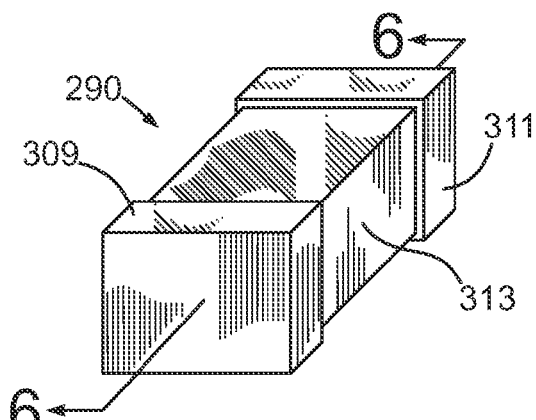
FIG. 5 is a pictorial view of an exemplary passive device that may be used with the exemplary semiconductor chip package depicted in FIG. 3.
Figure 6:
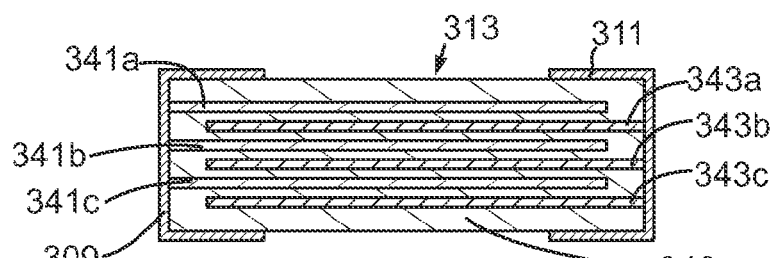
FIG. 6 is a sectional view of FIG. 5 taken at section 6-6.

Additional details of the capacitor 290 may be understood by referring now to FIGS. 5 and 6. FIG. 5 is a pictorial view of the capacitor 290 removed from the package depicted in FIGS. 3 and 4. The external terminals 309 and 311 and the central portion 313 are visible. The external terminals 309 and 311 may be fabricated from various conductor materials, such as copper, silver, gold, palladium, platinum, gold-tin alloy, nickel, tantalum nitride, titanium-tungsten, mixtures of these or the like. The central portion 313 of the capacitor 290 includes a laminate structure of insulating material and overlapping capacitor plates that are visible in FIG. 6. Attention is now turned to FIG. 6, which is a sectional view of FIG. 5 taken at section 6-6. The terminal 309 is connected to capacitor plates 341a, 341b and 341c and the terminal 311 is connected to capacitor plates 343a, 343b and 343c. The plates 341a, 341b and 341c and 343a, 343b and 343c are interspersed with an insulating material 346. The plates may be composed of a variety of materials. In an exemplary embodiment, a copper powder is mixed with various ceramic powders, such as silica or boron oxide or both and a solvent. Silver, gold, palladium, platinum, gold-tin alloy, nickel, tantalum nitride, titanium-tungsten, mixtures of these or the like may optionally be used as the base conductor. The insulating material 346 is advantageously formed from high dielectric constant or so-called "high K" ferro electric materials suitable to serve as the capacitor dielectric layers disclosed elsewhere herein. Exemplary materials include, for example, barium titanate, strontium titanate, magnesium titanate, barium neodymium titanate, barium strontium titanate, calcium magnesium titanate, tantalum oxide, titanate, zirconium tin titanate or the like. Additives, such as alumina, magnesia, berylia, calcium, corderite ($Mg+Al+SiO_2$), forsterite, niobate, silica, zirconia, boro-silicate or the like may be used to modify the high temperature and dielectric constant properties of the insulating material 346. The insulating material may be formed from layers of a sheet or a tape. Commercially available examples are known in the industry as "green sheets" or "green tapes." After stacking with the plates 341a, 341b and 341c, 343a, 343b and 343c and the terminals 309 and 311a baking process is performed to fuse the multiple sheets into a unitary structure and ohmically connect up the terminals 309 and 311. In this illustrative embodiment, the capacitor 290 includes two external terminals 309 and 311 and six plates 341a, 341b, 341c, 343a, 343b and 343c. However, it should be understood that the capacitor 290 can take on a myriad of configurations involving different numbers and types of overlapping conductors and terminals and terminations, etc.

Figure 7:
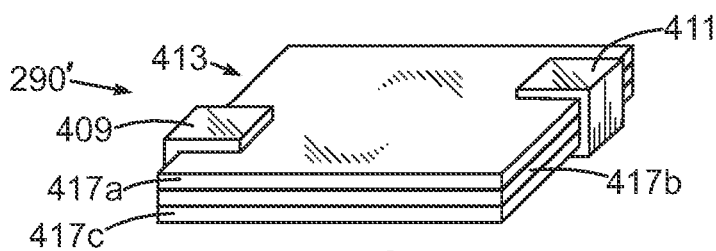
FIG. 7 is a pictorial view of an alternate exemplary passive device that may be used with the exemplary semiconductor chip package depicted in FIG. 3.
Figure 8:
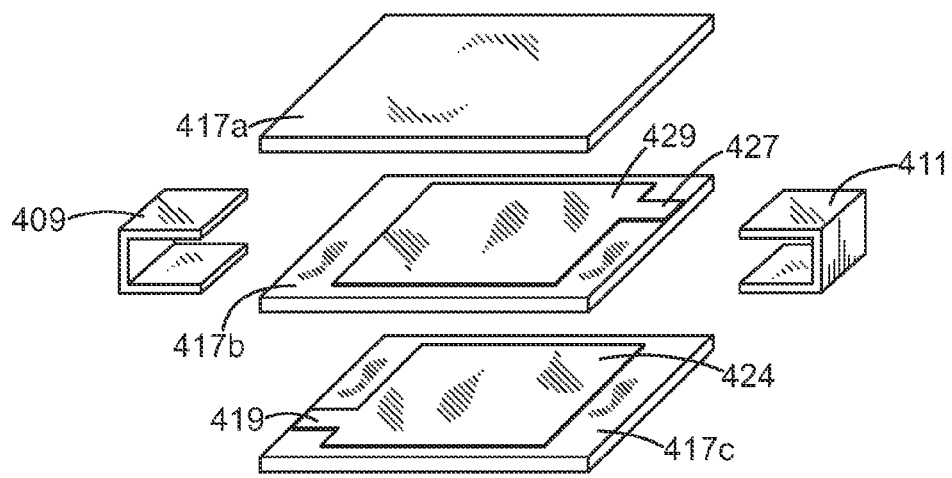
FIG. 8 is a partially exploded pictorial view of the alternate exemplary passive device depicted in FIG. 7.

Another exemplary embodiment of a capacitor 290' that may be used with any of the package embodiments disclosed herein is depicted in FIG. 7, which is a pictorial view. In this illustrative embodiment, external terminals 409 and 411 are situated on opposite sides and corners of a core 413. Such an arrangement may be useful where connection sites on a carrier substrate and underlying printed circuit board are offset or where it would otherwise make sense to use offset terminals. The core 413 may include multiple dielectric layers. In this illustrative embodiment, there are three such dielectric layers 417a, 417b and 417c. To illustrate further details of the capacitor 290', the capacitor 290' is shown partially exploded in FIG. 8. The external terminal 409 may be connected to an electrode 419 of a conductor plate 424 and the external terminal 411 may be connected to an electrode 427 of a conductor plate 429 that is separated from the conductor plate 424 by the dielectric layer 417b. The conductor plate 424 may be sandwiched between the layers 417b and 417c and the plate 429 may be sandwiched between the layers 417a and 417b. The electrodes 419, 427, plates 424, 429, terminals 409 and 411 and dielectric layers 417a, 417b and 417c may be fabricated from the same types of materials disclosed herein for the capacitor 290.

In the foregoing illustrative embodiments, individual capacitors are separately connected to an underside of a carrier substrate. However, it is possible to construct a mechanically joined array of capacitors and connect that array to an underside of a carrier substrate. Such an arrangement may provide for ease of mounting and alignment with interconnect sites. In this regard, attention is now turned to FIG. 9, which is a sectional view of an alternate exemplary embodiment of a semiconductor chip package 510, which is shown mounted to a printed circuit board 515 and includes a semiconductor chip 520 mounted on a carrier substrate 525. This illustrative embodiment may include plural solder joints 530 and a ball grid array 550 as generally described elsewhere herein along with an interconnect system represented by the black lines, two of which are labeled 570 and 573. Here, a capacitor array 577 consists of three capacitors 579a, 579b and 579c joined together but electrically connected to respective solder connections, one of which is labeled 581, of the printed circuit board 515 and corresponding solder connections, one of which is labeled 583, of the carrier substrate 525. The solder connections, for example, the connections 581 and 583, may be configured like the solder connections 321 and 316 depicted in FIG. 4.

Figure 9:
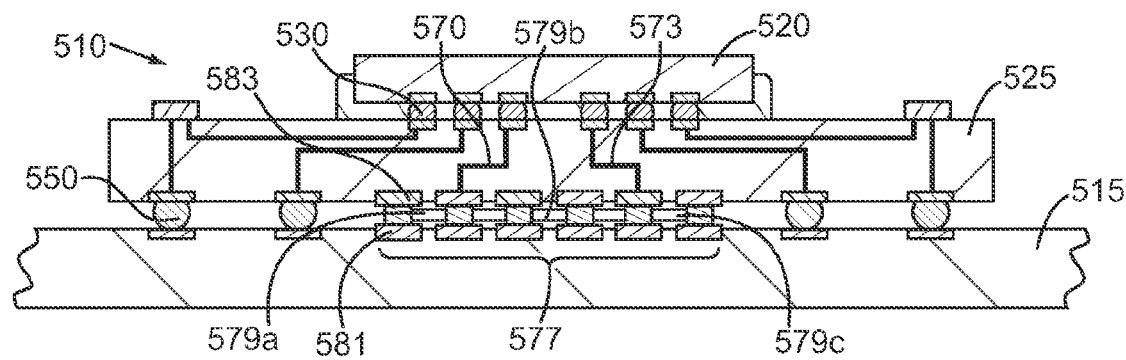
FIG. 9 is a sectional view of an alternate exemplary embodiment of a semiconductor chip package.
Figure 10:
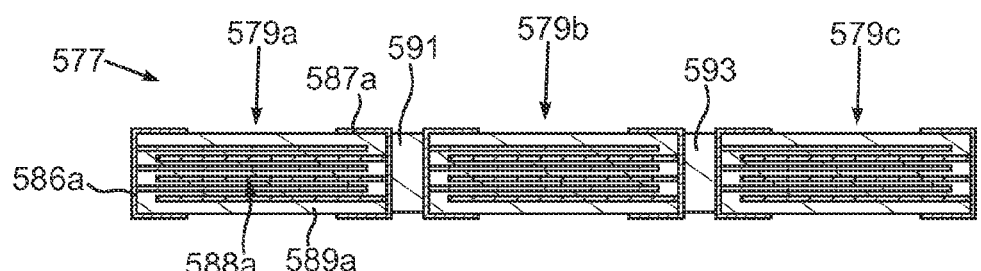
FIG. 10 is a sectional of an alternate exemplary passive device that may be used with the alternate exemplary semiconductor chip package.

The capacitor array 577 is shown removed from the package 510 depicted in FIG. 9 and at greater magnification in FIG. 10. The structure of the capacitor 579a will be illustrative of the other capacitors 579b and 579c. The capacitor 579a may consist of terminals 586a and 587a that are electrically connected to a plate arrangement 588a that is interspersed with insulating material 589a. The other capacitors 579b and 579c may have the same or a different configuration as desired. The capacitors 579a and 579b may be joined by a dielectric bridge 591 and the capacitors 579b and 579c may be joined by another dielectric bridge 593. The insulating material 589a may be composed of the same types of materials as the other exemplary capacitors disclosed herein. The same is true of the conductor structures of the capacitors 579a, 579b and 579c. The dielectric bridges 591 and 593 may be composed of the same materials used to form the insulating material 589a. Optionally, other polymeric materials such as epoxies or other bonding agents may be used for the bridges 591 and 593. The number of capacitors 579a, 579b and 579c in the array 577 may vary greatly.

Figure 11:
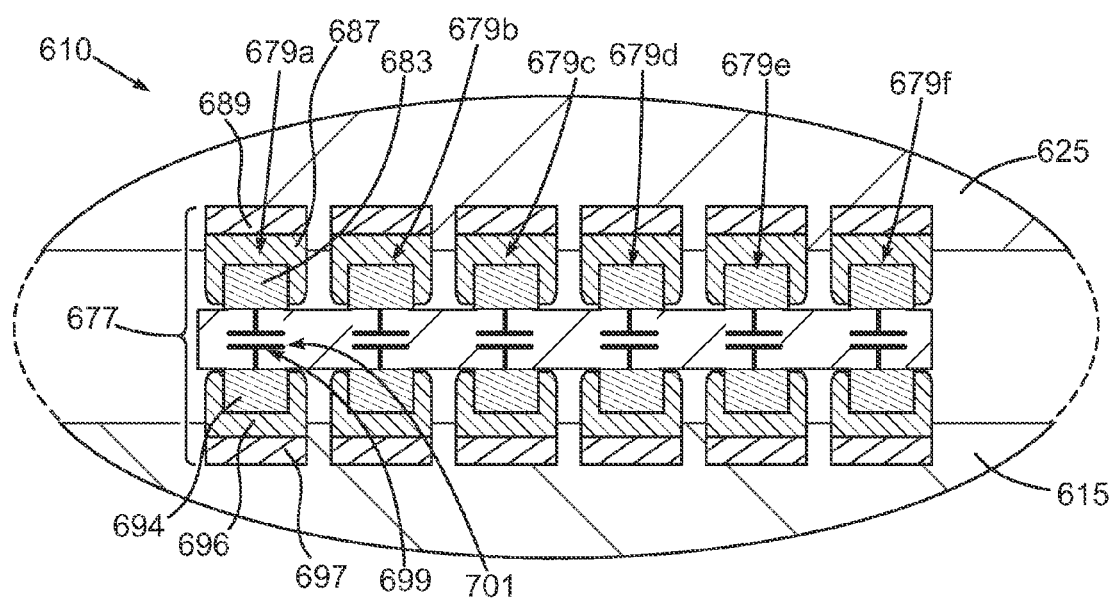
FIG. 11 is a sectional view of another alternate exemplary passive device that may be used with a semiconductor chip package.

Another alternate exemplary embodiment of the semiconductor chip package 610 may be understood by referring now to FIG. 11, which is a sectional view of a magnified portion of the package 610 that is not unlike the magnified view shown in FIG. 4. Accordingly, the semiconductor chip for the package 610 is not visible in FIG. 11. Here, a carrier substrate 625 is seated on a printed circuit board 615. A vertical array 677 of capacitors is connected between the printed circuit board 615 and the carrier substrate 625. The array 677 includes capacitors 679a, 679b, 679c, 679d, 679e and 679f. The structure of the capacitor 679a will be illustrative of the others 679b, 679c, 679d, 679e and 679f in the array 677. The capacitor 679a may include a terminal 683 connected to a solder structure 687 and conductor pad 689 of the carrier substrate 625 and an external terminal 694 connected to a solder structure 696 and a conductor pad 697 of the printed circuit board 615. The capacitor 679a may include a capacitor plate arrangement 699 that may include two or more overlapping conductor plates. The plate arrangement 699 may be surrounded by a dielectric fill 701 that may be shared with the other capacitors 679b, 679c, 679d, 679e and 679f as shown. The capacitors 679a, 679b and 679c, 679d, 679e and 679f may be composed of the same materials disclosed herein for the other exemplary embodiments.

Figure 12:
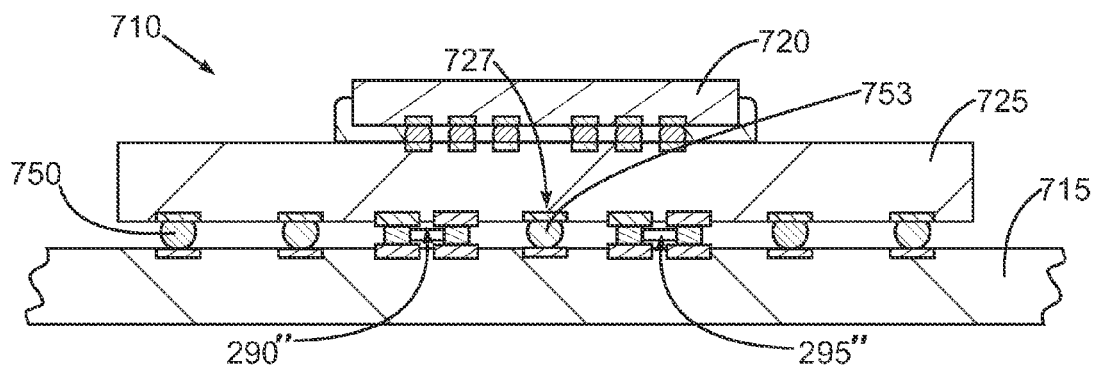
FIG. 12 is a sectional view of another alternate exemplary embodiment of a semiconductor chip package.

In the foregoing illustrative embodiments, the capacitors are positioned in a central location of the underside of the carrier substrate and displace what would otherwise be solder balls or other input/output structures. However, various other arrangements are envisioned. In this regard, attention is now turned to FIG. 12, which is a sectional view like FIG. 3 but of an alternate exemplary embodiment of a semiconductor chip package 710 mounted on a printed circuit board 715 and including a semiconductor chip 720 mounted on a carrier substrate 725. The package 710 may be substantially similar to the package 210 depicted in FIG. 3 with a couple of exceptions. For simplicity of illustration many of the structures that were described separately in FIG. 3 are not labeled or separately described in FIG. 12. In this illustrative embodiment, capacitors 290" and 295" may be positioned proximate a central location 727 of the carrier substrate 725. However, instead of displacing all of the input/output structures, such as the solder balls 750, the capacitors 290" and 295" may be intermingled with one or more solder balls, one of which is shown and labeled 753. The capacitors 290" and 295" may be composed of the same materials disclosed herein for the other exemplary embodiments.

Figure 13:
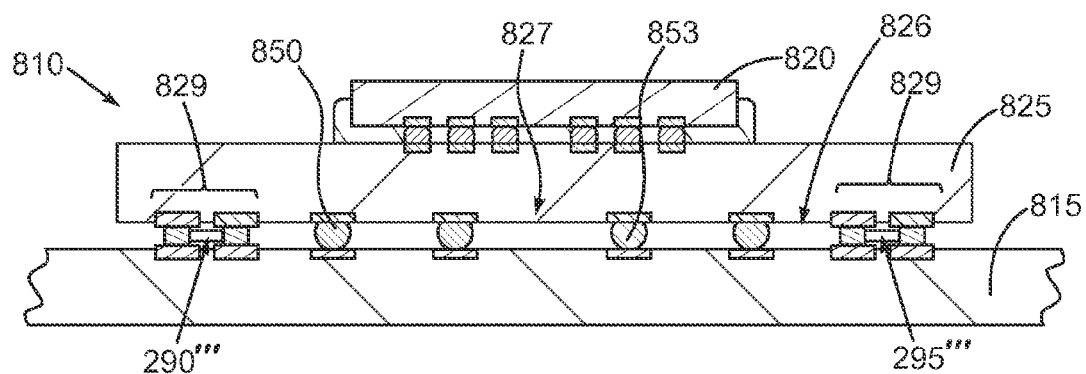
FIG. 13 is a sectional view of another alternate exemplary embodiment of a semiconductor chip package.

FIG. 13 depicts another alternate exemplary embodiment of a semiconductor chip package 810 that is shown mounted on a printed circuit board 815 and includes a semiconductor chip 820 mounted on a carrier substrate 825. In this illustrative embodiment, also depicted with some simplification like the embodiment of FIG. 12, capacitors 290''' and 295''' may be mounted on an underside 826 of the carrier substrate 825. However, instead of being positioned proximate a central portion 827 of the carrier substrate 825, the capacitors 290''' and 295''' may be positioned at a peripheral portion 829 of the carrier substrate 825 and the input/output structures, such as the solder balls 850 and 853, among others, may be positioned proximate the central portion 827 of the carrier substrate 825 and thus nearer thereto than the capacitors 290''' and 295'''. The capacitors 290''' and 295''' may be composed of the same materials disclosed herein for the other exemplary embodiments.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   coupling a semiconductor chip to a first side of a carrier substrate, the carrier substrate including a second side opposite the first side, the second side comprising plural input/output structures;
   coupling together plural discrete passive devices; and
   coupling the plural coupled discrete passive devices to the second side of the carrier substrate at a position further from a center of the second side of the carrier substrate than the plural input/output structures, the plural coupled discrete passive devices including at least one first terminal electrically coupled to the semiconductor chip and at least one second terminal adapted to couple to a printed circuit board.

2. A method of manufacturing, comprising:
   coupling a semiconductor chip to a first side of a carrier substrate, the carrier substrate including a second side opposite the first side;
   coupling together plural discrete passive devices;
   coupling the plural coupled discrete passive devices to the second side of the carrier substrate, the plural coupled discrete passive devices including at least one first terminal electrically coupled to the semiconductor chip and at least one second terminal adapted to couple to a printed circuit board; and
   coupling at least one passive device to the first side of the carrier substrate.

3. A method of manufacturing, comprising:
   coupling a semiconductor chip to a first side of a carrier substrate, the carrier substrate including a second side opposite the first side, the second side of the carrier substrate comprises plural input/output structures;
   coupling the second side of the carrier substrate to a printed circuit board with plural solder structures so as to leave a gap between the second side of the carrier substrate and the printed circuit board;
   coupling together plural discrete passive devices;
   structurally and electrically coupling the second side of the carrier substrate to the printed circuit board with the plural coupled discrete passive devices; and
   wherein the plural coupled discrete passive devices are at a position further from a center of the second side of the carrier substrate than the plural input/output structures.

4. A method of manufacturing, comprising:
   coupling a semiconductor chip to a first side of a carrier substrate, the carrier substrate including a second side opposite the first side;
   coupling the second side of the carrier substrate to a printed circuit board with plural solder structures so as to leave a gap between the second side of the carrier substrate and the printed circuit board;
   coupling together plural discrete passive devices;
   structurally and electrically coupling the second side of the carrier substrate to the printed circuit board with the plural coupled discrete passive devices; and
   coupling at least one passive device to the first side of the carrier substrate.

5. An apparatus, comprising:
   a carrier substrate having a first side and a second side opposite the first side;
   a semiconductor chip coupled to the first side of the carrier substrate;
   a mechanically joined group of discrete passive devices coupled to the second side of the carrier substrate, the group having at least one terminal adapted to couple to a printed circuit board; and wherein the second side of the carrier substrate comprises plural input/output structures positioned nearer a center of the second side of the carrier substrate than the group of discrete passive devices.

6. An apparatus, comprising:
a carrier substrate having a first side and a second side opposite the first side;
a semiconductor chip coupled to the first side of the carrier substrate;
a mechanically joined group of discrete passive devices coupled to the second side of the carrier substrate, the group having at least one terminal adapted to couple to a printed circuit board; and
at least one passive device coupled to the first side of the carrier substrate.

7. An apparatus, comprising:
a printed circuit board;
a carrier substrate having a first side and a second side opposite the first side, the second side including plural solder structures coupled to the printed circuit board so as to leave a gap between the second side of the carrier substrate and the printed circuit board;
a semiconductor chip coupled to the first side of the carrier substrate;
a mechanically joined group of discrete passive devices positioned in the gap, the group including at least terminal coupled to the second side of the carrier substrate and at least one terminal coupled to the printed circuit board; and
wherein the plural solder structures are positioned nearer a center of the second side of the carrier substrate than the group of discrete passive devices.

8. An apparatus, comprising:
a printed circuit board;
a carrier substrate having a first side and a second side opposite the first side, the second side including plural solder structures coupled to the printed circuit board so as to leave a gap between the second side of the carrier substrate and the printed circuit board;
a semiconductor chip coupled to the first side of the carrier substrate;
a mechanically joined group of discrete passive devices positioned in the gap, the group including at least terminal coupled to the second side of the carrier substrate and at least one terminal coupled to the printed circuit board; and
at least one passive device coupled to the first side of the carrier substrate.

9. The method of claim 1, comprising coupling the at least one second terminal to a printed circuit board.

10. The method of claim 1, wherein the plural discrete passive devices comprise capacitors.

11. The method of claim 2, wherein the second side of the carrier substrate comprises plural input/output structures and the method comprising coupling the plural discrete passive devices at a position nearer a center of the second side of the carrier substrate than the plural input/output structures.

12. The method of claim 3, wherein the plural coupled discrete passive devices comprise capacitors.

13. The method of claim 4, wherein the second side of the carrier substrate comprises plural input/output structures and the method comprising coupling the plural coupled discrete passive devices at a position nearer a center of the second side of the carrier substrate than the plural input/output structures.

14. The apparatus of claim 5, comprising a printed circuit board coupled to the at least one terminal.

15. The apparatus of claim 5, wherein the discrete passive devices comprise capacitors.

16. The apparatus of claim 6, wherein the second side of the carrier substrate comprises plural input/output structures and the group of discrete passive devices is positioned nearer a center of the second side of the carrier substrate than the plural input/output structures.

17. The apparatus of claim 7, wherein the discrete passive devices comprise capacitors.

18. The apparatus of claim 8, wherein the second side of the carrier substrate comprises plural input/output structures and the group of discrete passive devices is positioned nearer a center of the second side of the carrier substrate than the plural input/output structures.

* * * * *